(12) United States Patent
Duzhev et al.

(10) Patent No.: US 7,153,398 B2
(45) Date of Patent: Dec. 26, 2006

(54) METHOD FOR PRODUCING FULLERENE-CONTAINING CARBON AND DEVICE FOR CARRYING OUT SAID METHOD

(75) Inventors: Georgy Andreevich Duzhev, St. Petersburg (RU); Igor Vladimirovich Basargin, St. Petersburg (RU); Boris Mikhailovich Filippov, St. Petersburg (RU); Nikolay Igorevich Alekseev, St. Petersburg (RU); Dmitry Vladimirovich Afanasiev, St. Petersburg (RU); Aleksandr Alekseevich Bogdanov, St. Petersburg (RU)

(73) Assignee: Euronano Spa, Gordolo (CH)

( * ) Notice: Subject to any disclaimer, the term of this patent is extended or adjusted under 35 U.S.C. 154(b) by 299 days.

(21) Appl. No.: 10/479,230

(22) PCT Filed: Mar. 5, 2002

(86) PCT No.: PCT/RU02/00083

§ 371 (c)(1),
(2), (4) Date: Dec. 1, 2003

(87) PCT Pub. No.: WO02/096800

PCT Pub. Date: Dec. 5, 2002

(65) Prior Publication Data

US 2004/0262145 A1    Dec. 30, 2004

(30) Foreign Application Priority Data

Jun. 1, 2001    (RU) .............................. 2001115747

(51) Int. Cl.
*C01B 31/00* (2006.01)
*B23K 15/00* (2006.01)
*B23K 9/02* (2006.01)
*B01J 19/08* (2006.01)

(52) U.S. Cl. ............ 204/173; 219/121.36; 219/121.11; 219/121.55; 423/414; 423/445 B; 423/461

(58) Field of Classification Search ................ 204/756, 204/173; 219/121.11, 121.36, 121.55, 121.59; 423/414, 445 B, 460, 461
See application file for complete search history.

(56) References Cited

U.S. PATENT DOCUMENTS 2,527,666 A * 10/1950 Winter .......................... 134/1

(Continued)

FOREIGN PATENT DOCUMENTS

JP          5009013          1/1993

(Continued)

*Primary Examiner*—Nam Nguyen
*Assistant Examiner*—Luan V. Van
(74) *Attorney, Agent, or Firm*—Dykema Gossett PLLC

(57) ABSTRACT

The inventive method for producing fullerene-containing carbon and the device for carrying out said method relate to the chemical industry and are used for producing fullerenes. Said method for producing fullerene-containing carbon consists in vaporising graphite in an electric arc between coaxial graphite electrodes. The graphite electrode is continuously moved inside the electric arc zone through the glow discharge zone. The products formed inside the electric arc are removed therefrom with the aid of an annular inert gas flow which is directed along the axes of the electrodes through an area arranged at a defined distance from a discharge axis. The inventive device for producing fullerene-containing carbon comprises a plasma reactor provided with a system for circulating inert gas and a system for recuperating fullerene carbon. Said reactor is provided with a chamber for degassing the graphite electrode which is continuously moved by the glow discharge towards the arc. The system for circulating inert gas is provided with an annular slot nozzle coaxially arranged in relation to the moving graphite electrode.

14 Claims, 4 Drawing Sheets

U.S. PATENT DOCUMENTS

| | | | |
|---|---|---|---|
| 3,057,708 A * | 10/1962 | Hilgers | 48/206 |
| 4,935,115 A * | 6/1990 | Chambaere et al. | 204/192.32 |
| 5,227,038 A | 7/1993 | Smalley et al. | 204/173 |
| 5,393,955 A | 2/1995 | Simmons | 219/121.59 |
| 5,493,094 A | 2/1996 | Simmons | 219/121.52 |

FOREIGN PATENT DOCUMENTS

| | | |
|---|---|---|
| RU | 2 121 965 | 11/1998 |

* cited by examiner

METHOD FOR PRODUCING FULLERENE-CONTAINING CARBON AND DEVICE FOR CARRYING OUT SAID METHOD

FIELD OF THE INVENTION

The present invention relates to manufacturing a fullerene-containing soot, the product containing a new allotrope of carbon in the form of molecules consisting of 60, 70, 84, or more carbon atoms that is finding application in chemistry, physics, industry, power engineering, electronics, biology, medicine and other fields.

DESCRIPTION OF THE PRIOR ART

Since 1985, when a team of scientists from Rice University (see: Kroto H. W., Heath J. R., O'Brien S. C., Curl R. F. and Smalley R. E.—"$C_{60}$: Buckminster-fullerene"—Nature.—v. 318, No. 6042, p.p. 162–163, Nov. 14, 1985) deciphered the structure of the fullerene molecule, a great variety of methods for manufacturing fullerenes and designs of apparatus for realization of these methods have been developed. However, no methods and apparatus have yet been suggested for manufacturing fullerene-containing products, in particular, the fullerene-containing soot, with high yield and at low cost.

One method is known of making the fullerene-containing soot, in which a graphite powder is introduced into a microwave gas discharge zone, where the graphite powder is vaporized and fullerenes are formed from the carbon vapor (see: Patent of Japan No. 05-238717, IPC C 01 B 31/02, filed Sep. 17, 1993).

Disadvantages of this method for fullerene-containing soot manufacturing are the low process output, low content of fullerenes in the soot, and high electricity consumption per gram of soot as well as the complexity of technical problems involved in microwave generation.

An apparatus is known for making the fullerene-containing soot comprising partially open enclosure capable of withstanding high temperatures, where an arc discharge is made to burn between graphite and tungsten electrodes. Condensation of carbon proceeds in a stream of a noble gas such as He, Ar, or Kr flowing through a horizontal tube placed in a magnetic field (see: Patent of Germany No.24205296, IPC C 01 B 31/02, filed Aug. 26, 1993).

The authors of that invention stated that with their apparatus the yield of fullerenes could be increased to 55%; however, this high yield value had not been confirmed in experiments. A disadvantage of this apparatus for making the fullerene-containing soot is low output.

Another method is known of making the fullerene-containing soot in which carbon is evaporated in a helium atmosphere by applying a d.c. voltage between two opposite graphite electrodes, one being anode and the other cathode, a helium flow is circulated, and the fullerene-containing soot formed is freed of the contained gas and collected (see: Patent of Japan No. 05-09013, IPC C 01 B 31/02, filed Jan. 19, 1993).

A disadvantage of the known method of making fullerene-containing soot is its insignificant yield explained by the fact that about half of the carbon vaporized from the anode is depositing not in the zone of condensation of the fullerene-containing soot but, instead, on the cathode, in the form of amorphous carbon and various nanostructures (nanotubes, nanoonions, etc.), lowering the yield of soot and complicating the maintenance of constant interelectrode distance when the method is used in modular installations with a common electrode displacement system.

An apparatus is known for making fullerene-containing soot comprising a graphite-rod anode of a diameter of 1 mm or more and an opposite electrode-cathode, the diameter of which is twice that of the anode, both placed in a cylindrical enclosure. The is enclosure has two apertures in it: the lower aperture for introducing helium and the upper one for removal of the gas contained in the carbon powder. The housing is also supplied with a suction-type collector for collecting the powder generated (see: Patent of Japan No. 05-09013, IPC C 01B 31/02, filed Jan. 19, 1993).

A disadvantage of the known apparatus is the impossibility of maintaining a symmetrical type of gas convection inside, which lowers the percentage of fullerenes in the soot. This apparatus has inherently low soot output because of small diameter of the graphite electrode vaporized.

A combination of substantial features that is closest to the method of the present invention for making the fullerene-containing soot is found in a method of making fullerene-containing soot by which a carbon vapor generation zone filled with an inert gas containing first and second graphite electrodes is provided and a sufficient voltage is applied between the electrodes to maintain an electric arc; the carbon vapor formed in the arc is carried with a stream of inert gas blown across the electric arc to a condensation zone where the fullerene-containing soot is collected (see: U.S. Pat. No. 5,227,038, IPC C 01 B 31/00, filed Jul. 13, 1993).

Disadvantages of the known method of making the fullerene-containing soot are the low output arising from the need to periodically interrupt the process in order to change the graphite rods and degass said rods in the reaction zone and distortion of the thermal conditions in the arc by the inert gas circulated across the arc causing a reduction in the fullerene content of the soot.

The closest to the apparatus of the present invention is an apparatus for making the fullerene-containing soot comprising a plasma reactor in the form of a sealed cylindrical evaporation chamber made of stainless steel where two graphite electrodes are arranged horizontally opposite one another. The first electrode via a water-cooled current feedthrough is connected to a voltage source. The second electrode is grounded via another water-cooled current feedthrough. The graphite electrodes are fixed in gears for displacement along their common axis to maintain the interelectrode gap width required for the arc. The apparatus also has an inert gas circulation system and means for entrapment of the soot formed in the burning arc. The housing of the evaporation chamber can be water-cooled (see: U.S. Pat. No. 5,227,038, IPC C 01 B 31/00, filed Jul. 13, 1993).

Disadvantages of the known prototype apparatus are low output caused by the necessity to periodically interrupt the process for replacement and degassing of the electrodes and removal of the soot deposited on the walls; lack of symmetry of the inert gas stream through the burning arc causing a reduction of the content of fullerenes in the soot, low yield of the soot compared with the quantity of graphite burnt in the arc because of the loss of about half the carbon vaporized from the anode due to its deposition on the cathode in the form of amorphous carbon and various nanostructures (nanotubes, nanoonions and others), the so-called cathode deposit.

SUMMARY OF THE INVENTION

The object of the present group of inventions is to develop a method for making fullerene-containing soot and an apparatus for its realization featuring a higher output of the fullerene-containing soot generation process in an electric arc, an increase in the percentage of fullerenes in the soot, and making the soot manufacturing process continuous.

To achieve the above object, in the method for manufacturing the fullerene-containing soot involving vaporization of graphite in an electric arc burning between axially aligned graphite electrodes under electrical voltage placed in an atmosphere of inert gas, transfer of the products formed with inert gas and their subsequent condensation in the form of fullerene-containing soot,—in said method the electrode advancing into the electric arc zone is first passed through a zone of electric glow discharge in an inert gas atmosphere whereas the products formed in the generation zone are taken away by an annular stream of inert gas blown along the axis of said electrodes. The annular stream of inert gas can also be made to twist around the electrode axis for more efficient removal of the soot from the generation zone. In order to remove the deposit forming on the cathode and thus stabilize the electric arc position the polarity of electrical voltage applied is alternated. For example, it can be maintained positive for a period of 2–15 minutes and then switched to negative for 1–5 minutes.

To further approach the object of the invention the apparatus for manufacturing the fullerene-containing soot comprising a plasma reactor in the form of a sealed cylindrical chamber, an inert gas recirculation system, means for entrapment of the fullerene soot, two graphite rod-shaped electrodes opposite one another and axially aligned with said chamber, of which the first is fixed in a cooled current feedthrough and the second is mounted in another cooled feedthrough and can be displaced axially, said reactor is additionally equipped with an antechamber for degassing the eroding graphite electrode by means of a glow discharge, the system of inert gas recirculation is supplemented with an annular-slit nozzle axially aligned with the graphite electrodes and the fullerene soot entrapment means is equipped with an electric separator at the inlet of the inert gas recirculation system. The internal radius R of the nozzle is preferably not less than 45 mm. The nozzle can be positioned at a distance of 30–40 mm from the plane passing through the midpoint of the interelectrode gap at a normal to its axis. In order to impart an axial rotation to the annular stream of inert gas a deflector can be mounted in the nozzle. The deflector may consist of strips fixed in the nozzle at an acute angle to its axis or it could be guiding blades or any other known design.

To the authors' knowledge, there is no information available in patents or scientific and technical literature of a similar method for manufacturing the fullerene-containing soot in an electric arc or of an apparatus possessing the combination of features of the present invention, which, in the opinion of the applicants, is an indication that the present group of inventions meets the novelty criterion.

As demonstrated in research by the authors, treatment of the graphite electrode by glow discharge in an inert gas atmosphere before it enters the electric arc zone and the removal of the products formed using an annular stream of inert gas flowing parallel to the outside of the fullerene generation zone permit realization of a continuous process of fullerene soot generation with high yield of fullerenes because it is possible in said process to continuously advance the graphite electrodes into the reactor and to remove the soot particles and fullerenes formed in the gas-plasma stream without interfering with the fullerene formation process.

This continuous process of manufacturing the fullerene-containing soot can be performed in the apparatus of the present invention comprising a chamber for degassing the movable electrode in a glow discharge, an inert gas recirculation system with an annular-slit nozzle axially aligned with the movable graphite electrode, and a means for entrapment of the fullerene soot incorporating an electrical separator mounted at the inlet of the inert gas recirculation system, said apparatus testifying to a definite innovative level of the present inventions.

BRIEF DESCRIPTION OF THE DRAWINGS

The method of the present invention for making fullerene-containing soot can be illustrated by an example of operation of the apparatus drawn in the figures, where.

Figure 2:
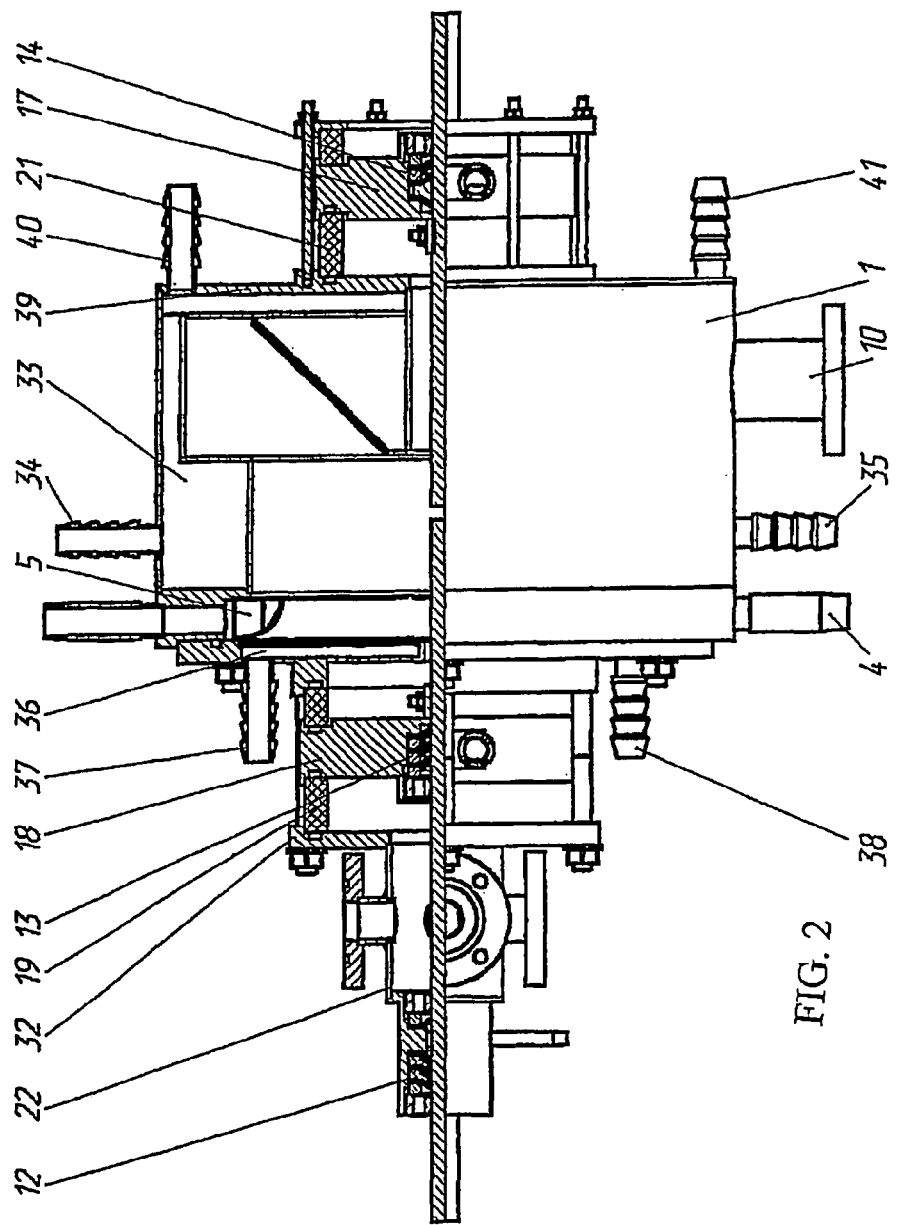
FIG. 2 is a general view of the plasma reactor chamber with a partial longitudinal section.
Figure 3:
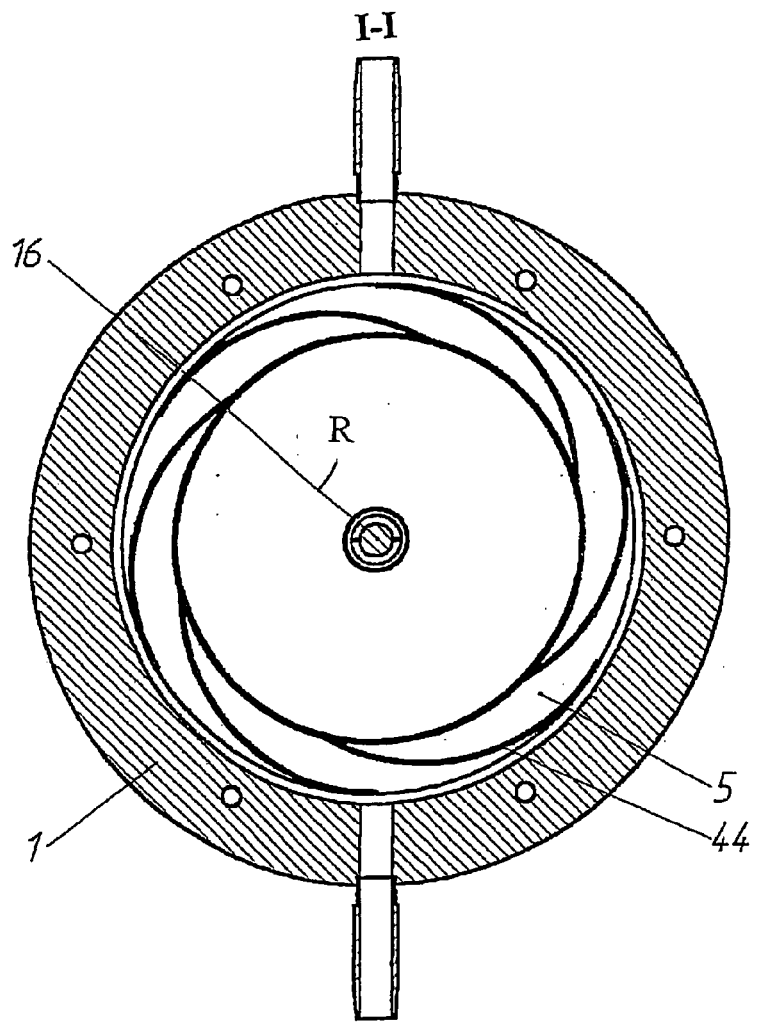
FIG. 3 is a cross-sectional view of the plasma reactor chamber along A—A.
Figure 4:
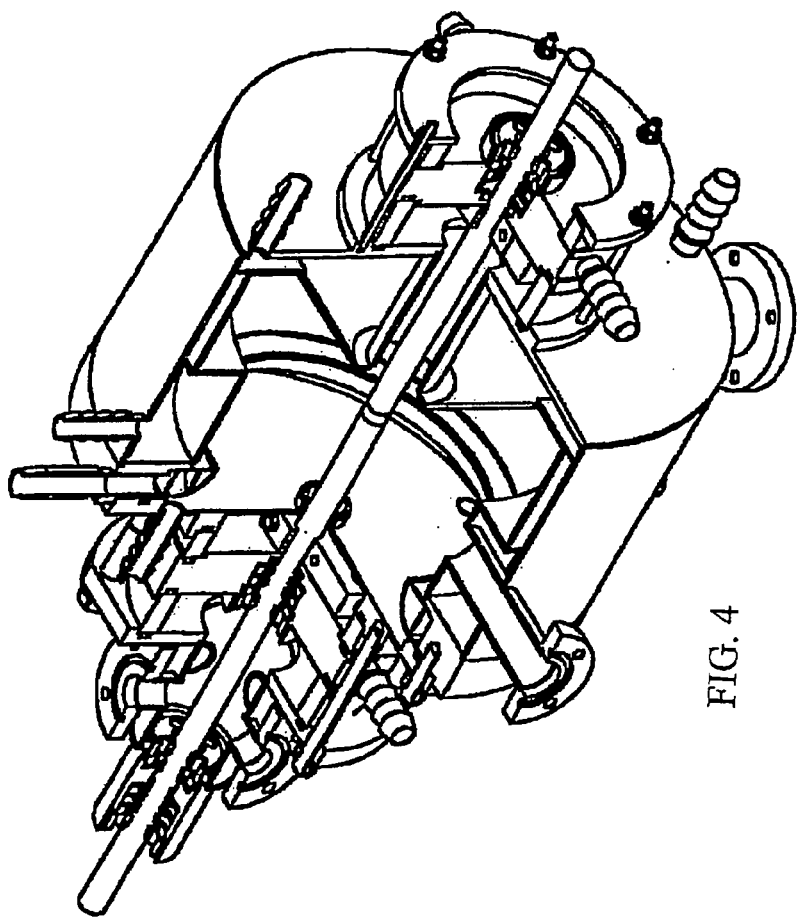
FIG. 4 is a general perspective view of the plasma reactor chamber with a partial longitudinal section.

The apparatus for manufacturing fullerene-containing soot (see FIG. 1) comprises hermetically sealed cylindrical chamber 1 having a recirculation system for inert gas (preferably, helium) consisting of blower 2 connected via conduit 3 and nipple 4 to an annular nozzle 5; means for fullerene soot entrapment 6 containing an electric separator 7 and a bag filter 8. Electric separator 7 is connected via conduit 9 to discharge 10 of chamber 1. The bag filter 8 is connected to the blower inlet by means of output flange 11. Through known-art Wilson seals (see, for example, B. S. Danilin and V. E. Minaichev, Fundamentals of designing vacuum systems, M., Energia, 1971, p. 221) along the axis of chamber 1 graphite electrodes 15 and 16 are introduced from opposite sides. Electrode 15 is usually fixed and connected by means of cooled current feedthrough 17 to one of the outputs of the arc power supply (not shown in the drawing). Electrode 16 is mounted in such a manner that it can be advanced or withdrawn through the cooled current feedthrough 18. Outputs of the arc power supply are electrically isolated from ground. Chamber 1 is grounded and current feedthroughs 17 and 18 are isolated from ground with isolators 19, 20 and 21. Electrode 16 is passing antechamber 22, where it is being degassed by the glow discharge. For this purpose a ring electrode 23 is installed in the antechamber 22 coaxially with the electrode 16. Terminal 24 of the ring electrode 23 is isolated from ground with isolator 25. Terminal 24 is connected to the positive output terminal of the glow discharge power source (not shown in the drawing). The negative output terminal of the glow discharge power source is connected to electrode 16. The output of the glow discharge power source is isolated from ground. Antechamber 22 is evacuated by fore-vacuum pump 26 and filled with inert gas (preferably, argon) from bottle 27 through inlet needle valve 28. Displacement of the electrode 16 is performed by a displacement system 29; its tappet 30 is isolated from electrode 16 with isolator 31. In order to prevent the soot formed in the arc discharge from depositing on electrode 15 the latter is enclosed in a conical screen 32. Chamber 1 can be cooled for, which purpose it has a jacket 33 (see FIG. 2) with nipples 34 and 35, jacket 36 with nipples 37 and 38, and jacket 39 with nipples 40 and 41. Nipples 34, 35, 37, 38, 40 and 41 are used for letting in and out the cooling agent (water can be used as a cooling agent). Electric separator 7 has an axial central electrode 42. Housing 43 of the electric separator 7 is grounded. In the nozzle 5 (FIG. 3), a deflector 44 can be mounted for twisting the annular stream of inert gas. Deflector 44 may have the form of guiding blades or strips mounted at an acute angle relative to the axis of nozzle 5.

MODIFICATIONS OF THE INVENTION

The method according to the present invention is performed as follows. Graphite electrodes 15 and 16 are inserted in feedthroughs 17 and 18, respectively. As electrodes, cylindrical graphite bars of a diameter 12 mm and length 400 mm are used. Chamber 1 is grounded and cooled current feedthroughs 17 and 18 are connected to the electric arc power supply. As a power supply, a rectifier of the type used in welding machines having a current reversal capability can be employed. Internal volumes of chamber 1, blower 2, electric separator 7, bag filter 8, internal pockets of the Wilson seals 12, 13, 14 and the antechamber 22 of the apparatus are evacuated to $10^{-2}$ Torr by vacuum pump 26 with a liquid nitrogen trap. Then the internal volume of chamber 1, electric separator 7, and bag filter 8 of the apparatus are filled with inert gas or a mixture of inert gases to a pressure from 80 Torr to the atmospheric pressure (preferably, 100 Torr). Under continuous fore-vacuum pumping a dynamic inert gas pressure of 0.1 to 10 Torr (preferably, 1 Torr) is established in antechamber 22 using inlet needle valve 28 connected to the inert gas bottle 27 (preferably, argon). Electrodes 16 and 17 are connected to negative and positive terminals of the glow discharge power supply and the glow discharge is initiated at a current of 1 to 100 mA (preferably, 10 mA). Pumping out of the internal pockets of Wilson seals 12, 13, and 14 is continued throughout the soot manufacturing process. Gas blower 2 is turned on. A cooling agent is pumped into feedthroughs 17, 18 and jackets 33, 36 and 39. From a high-voltage power supply (not shown in the drawing) a voltage of 8–10 kV is applied with the negative terminal connected to the central electrode 42 of electric separator 7 and positive to the grounded housing 43. Electrodes 15 and 16 are connected to negative and positive terminals, respectively, of the arc discharge power supply. An arc discharge is initiated between electrodes 15 and 16 and the operating regime of the arc burning is adjusted (discharge current and interelectrode separation). Advancement system 29 is turned on and an appropriate progression rate of the tappet 30 is established so as to compensate the evaporation of electrode 16 and thus maintain constant the interelectrode gap. Carbon evaporating from the electrode 16 is leaving the arc zone in the radial direction, part of it collecting on electrode 15 and forming the cathode deposit. Therefore, at regular intervals (preferably, 2–15 minutes), the polarity of electrodes 15 and 16 is reversed in order to burn the deposit formed on electrode 15. At reversed polarity the deposit burns out on electrode 15 but forms on electrode 16. The time of operation with reversed polarity is chosen long enough for the deposit on electrode 15 to burn out completely (reversed polarity time of 1–5 minutes is preferable). Then the polarity is switched back.

After certain portion of the graphite rod 16 has been used up, next graphite rods is connected to its rear end (for this purpose the ends of the rods are profiled for male-to-female connection). In this way continuous operation of the apparatus is achieved. While passing through antechamber 22, electrode 16 is degassed by the glow discharge maintained between electrodes 16 and 23. As the glow discharge voltage is much higher than the arc voltage, reversal of the arc polarity has little effect on the glow discharge regime in antechamber 22. The degassing products are pumped out of antechamber 22 by fore-vacuum pump 26 and the inert gas pressure necessary for the glow discharge is maintained by means of bottle 27 with the inlet needle valve 28.

The annular stream of inert gas coming out of nozzle 5 picks up the carbon transformation products and through nipple 10 and conduit 9 carries them to electric separator 7, where they collect on the grounded enclosure 43 in the form of fullerene-containing soot. Due to low-frequency, low-amplitude vibrations of the walls of electric separator 7 the soot particles fall off into the bag filter 8. Besides, soot particles that passed the electric separator 7 are entrapped by bag filter 8 and the inert gas after purification is pumped back into chamber 1 by blower 2 through nozzle 5. When the bag filter 8 is full of soot the apparatus is either switched to a different entrapment unit or the process is stopped for cleaning the bag filter 8. The annular stream of inert gas can be simultaneously rotated around the axis of nozzle 5 by deflector 44.

EXAMPLE 1

Figure 1:
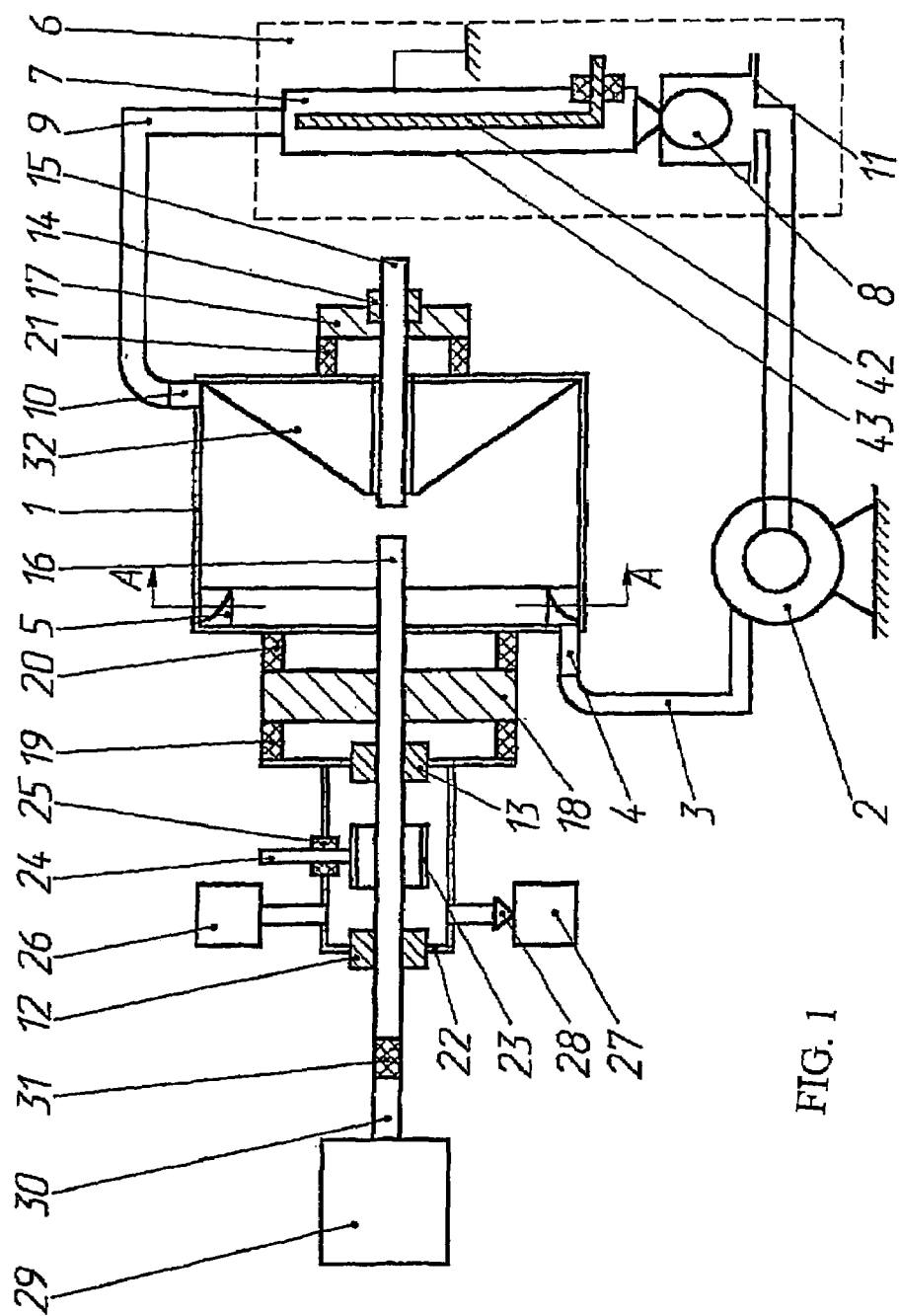
FIG. 1 is a schematic of the apparatus for making fullerene-containing soot.

Three series of experiments on fullerene-containing soot manufacture were carried out on a prototype apparatus shown in FIG. 1 for three different distances R between the slit of nozzle 5 and the arc axis (four experiments in each series, data averaged). Axially the annular nozzle 5 was positioned at a distance of 30 mm off the midpoint of the interelectrode gap. As electrodes, graphite rods 6 mm in diameter were used. The arc was maintained with a d.c. forward current of 70 A; as inert gas, helium at a pressure of 100 Torr was used; the interelectrode distance was maintained constant at 4 mm; and the helium flow velocity at the exit of the annular nozzle was 5 m/s. The advancing electrode 16 was degassed by the glow discharge as it passed inside antechamber 22. No voltage was applied to the electric separator 7. Quantity of the soot collected on the walls of electric separator 7 and bag filter 8 as a percentage of the total quantity of produced soot as well as the fullerene content in the soot were determined. The results are shown in Table 1.

TABLE 1

| Item # | R, mm | Quantity of soot collected in the electric separator and bag filter, % | Fullerene content in the soot, % |
| --- | --- | --- | --- |
| 1 | 20 | >99.5 | <0.5 |
| 2 | 46 | 99.0 | 12.1 |
| 3 | 70 | 95.0 | 14.2 |

From the above data it is seen that even at large R practically all soot is carried away by the helium flow and collected in the electric separator 7 and bag filter 8. However, at small R the fullerene content in the soot is low.

EXAMPLE 2

Experiments were carried out on the apparatus (FIG. 1) with the use of reversible current supply. In these experiments there no helium blowing was used and the soot was collected from the walls of chamber 1. Moving electrode 16 and fixed electrode 15 were graphite rods 6 mm in diameter. The helium pressure was 100 Torr; the forward and reverse arc discharge currents were identical and equal to 80 A. The starting interelectrode gap was 4 mm. Displacement velocity of the electrode 16 in all experiments was practically constant and equal to about 4 mm/min. The fullerene content of about 11–13% in the soot was weakly dependent on arc regime. The results of the experiments are given in table 2.

Notation in the columns of table 2 is as follows.

$T_1$—time period of the forward arc current (moving electrode 16 connected to positive terminal of the arc power supply);
$T_2$—time period of the reverse arc current;
K—number of current reversals in one experiment;
$d_k$—interelectrode gap at the end of experiment.

TABLE 2

| Item # | $T_1$, min. | $T_2$, min. | K | $d_k$, mm |
|---|---|---|---|---|
| 1 | 1 | 1 | 6 | 7*) |
| 2 | 15 | 1 | 6 | 1 |
| 3 | 15 | 5 | 6 | 4 |
| 4 | 10 | 3.5 | 20 | 4 |

*)Both electrodes are eroding.

As seen in Table 2, at a certain ratio of the arc burning time periods in forward and reverse polarity periodic voltage polarity reversal prevents the formation of cathode deposit so that the interelectrode gap and the arc position remain practically constant. As a result, a continuous fullerene manufacturing process is realized.

INDUSTRIAL APPLICABILITY

With the apparatus complete with all the systems: the plasma reactor (FIG. 1); the system of advancing and joining the graphite rods; the gas blower with the closed helium recirculation loop; and the entrapment system for the fullerene-containing soot, exhaustive operational tests have been carried out at the following parameters:
uninterrupted reactor operation time: 10 hours;
number of 12 mm diameter graphite rods vaporized in the reactor: 7 pieces;
arc current: 320 A;
helium pressure in the reactor: 300 mm of mercury;
moving electrode advancement rate: 10 mm/min;
helium flow rate through the closed recirculation loop: 200 cm$^2$/min;
the glow discharge current: 10 mA; and
the electric separator voltage: 8 kV.
After the test:
bag filter contained 923 g of the soot;
fullerene content in the soot determined by the standard method of toluene solution absorption was 10.5–11.0%.

The invention claimed is:

1. A method of continuously manufacturing fullerene-containing soot by vaporizing graphite in an electric arc maintained between two axially aligned graphite electrodes in an inert gas atmosphere by means of a hermetically sealed cylindrical chamber, removing the products formed in the electric arc with a stream of inert gas and their subsequent deposition in the form of the fullerens-containing soot, wherein at least one of the graphite rods is movable along the axis of said chamber, comprising the steps of:
passing the graphite electrode being fed into the electric arc zone through a glow discharge zone,
applying to the graphite electrode being fed into said electric arc zone a d.c. electrical voltage,
alternating its polarity between positive and negative for predetermined time intervals enough to burn the carbon deposit formed on said electrodes during vaporization in said chamber, and
removing said products from the electric arc zone by an annular stream of inert gas blown in said electric arc zone by means of an annular nozzle having a specified radius R,
wherein said annular nozzle is substantially aligned coaxially with said electrodes.

2. A method according to claim 1 comprising:
simultaneously rotating said annular stream of inert gas around the axis of said electrodes.

3. A method according to claim 1 comprising:
alternating said polarity between positive for 2–15 minutes and negative for 1–5 minutes.

4. A method according to claim 1 wherein said specified radius R of said nozzle is >45 mm.

5. An apparatus for manufacturing fullerene-containing soot incorporating a plasma reactor in the form of hermetically sealed cylindrical chamber, an inert gas circulation system, a means for collecting the fullerene-containing soot, two graphite rod-like electrodes, the first electrode being firmly fixed in a cooled current feedthrough and the second electrode, mounted in another cooled current feedthrough, that can be moved in axial direction, comprising:
an additional chamber for degassing said moving graphite electrode in a glow discharge,
an inert gas recirculation system provided with an annular-slit nozzle substantially aligned coaxially with said electrodes,
means for entrapment of the fullerene-containing soot comprising an electric separator at the inlet of said inert gas recirculation system; and
means for applying to the graphite electrode a d.c. electrical voltage and altering its polarity between positive and negative for predetermined time intervals enough to burn the carbon deposit formed on said electrodes.

6. An apparatus according to claim 5 comprising a means for joining further graphite rods to the moving graphite electrode.

7. An apparatus according to claim 5 comprising a means for feeding the movable graphite electrode to said reactor.

8. An apparatus according to claim 5 wherein the internal radius of said nozzle is equal to R>45 mm.

9. An apparatus according to claim 5 wherein the outlet of said nozzle is positioned at a distance of 30–40 mm from the cross section through the midpoint of the interelectrode gap.

10. An apparatus according claim 5 comprising a deflector mounted in the nozzle.

11. An apparatus according to claim 10 wherein said deflector is made in the form of strips mounted in the nozzle at an acute angle to its axis.

12. An apparatus according to claim 10 wherein said deflector is made in the form of guiding blades.

13. A method of continuously manufacturing fullerene-containing products by vaporizing graphite in an electric arc maintained between two axially aligned graphite electrodes in an electric arc zone in a hermetically sealed cylindrical chamber containing an inert gas atmosphere, removing the products formed in the electric arc with a stream of inert gas and subsequent deposition of the products in the form of fullerene-containing soot, wherein at least one of the graphite rods is movable along the axis of the chamber, comprising the steps of:
feeding the at least one graphite electrode along the axis of the chamber into a glow discharge zone for degassing the electrode;
thereafter feeding the graphite electrode along the axis of the chamber into the electric arc zone;

applying a d.c. electrical voltage of a selected polarity to the graphite electrodes for producing an arc for vaporizing the electrodes;

alternating the polarity of the d.c. electrical voltage applied to the electrodes between a positive and negative polarity for predetermined time intervals sufficient to burn carbon deposits formed on the electrodes during vaporization thereof; and aligning an annular nozzle having a radius R coaxially with the electrodes; and blowing an annular stream of inert gas through the annular nozzle coaxially around the electrodes for removing said soot from the electric arc zone.

14. An apparatus for manufacturing fullerene-containing product comprising:

a plasma reactor in the form of a hermetically sealed cylindrical chamber having a central axis;

first and second electrodes being axially aligned along the axis;

an inert gas circulation system;

a vaporization region for vaporizing at least one of the electrodes to produce soot containing the product;

a collector for collecting the soot caused by vaporization of the electrodes;

a first cooled current feedthrough for mounting the first electrode in the chamber, and a second cooled current feedthrough for mounting the second electrode in the chamber for axial movement along said axis;

a glow discharge chamber for degassing said movable electrode;

an inert gas recirculation system having an annular-slit nozzle coaxially aligned with the electrodes and an inlet, an electric separator at the inlet of said inert gas recirculation system for entrapping soot; and an input for d.c. electric voltage to the electrodes;

a polarity changer coupled to the input for the electrodes for alternating the electrical voltage between positive and negative polarity for selected time intervals sufficient to burn off carbon deposits formed on the electrodes during vaporization of the electrode.

* * * * *

UNITED STATES PATENT AND TRADEMARK OFFICE
CERTIFICATE OF CORRECTION

PATENT NO. : 7,153,398 B2
APPLICATION NO. : 10/479230
DATED : December 26, 2006
INVENTOR(S) : Duzhev et al.

It is certified that error appears in the above-identified patent and that said Letters Patent is hereby corrected as shown below:

On the Title Page,

Item (73) should read: Assignee: Job Joint, Vicenza, Italy

Signed and Sealed this

Tenth Day of November, 2009

David J. Kappos
*Director of the United States Patent and Trademark Office*